United States Patent [19]

Swanson et al.

[11] Patent Number: 5,030,796
[45] Date of Patent: Jul. 9, 1991

[54] REVERSE-ENGINEERING RESISTANT ENCAPSULANT FOR MICROELECTRIC DEVICE

[75] Inventors: Dale W. Swanson, Yorba Linda; James J. Licari, Whittier, both of Calif.

[73] Assignee: Rockwell International Corporation, El Segundo, Calif.

[21] Appl. No.: 392,799

[22] Filed: Aug. 11, 1989

[51] Int. Cl.⁵ ..................... H01L 23/28; H01L 23/02
[52] U.S. Cl. .................. 174/52.2; 174/52.4; 357/72
[58] Field of Search .............. 357/72, 73, 74, 75, 357/80; 174/52.4, 52.2

[56] References Cited

U.S. PATENT DOCUMENTS

| | | |
|---|---|---|
| 3,394,218 | 7/1968 | Foudriat . |
| 3,693,252 | 9/1972 | Roberston et al. . |
| 3,702,464 | 11/1972 | Castrucci . |
| 3,749,601 | 4/1971 | Tittle ........................ 29/575 |
| 3,778,685 | 12/1973 | Kennedy ................. 317/234 R |
| 3,828,425 | 8/1974 | Manus .................... 29/590 |
| 3,889,365 | 6/1975 | Brock ..................... 29/627 |
| 4,001,655 | 1/1977 | Voyles et al. ............ 317/230 |
| 4,101,352 | 7/1978 | Poulin et al. . |
| 4,250,347 | 2/1981 | Fierkens ................. 174/52.2 |
| 4,264,917 | 4/1981 | Ugon . |
| 4,434,361 | 2/1984 | Meinguss et al. . |
| 4,788,583 | 11/1988 | Kawahara et al. . |

*Primary Examiner*—Leo P. Picard
*Assistant Examiner*—Bot L. Ledynh
*Attorney, Agent, or Firm*—H. Fredrick Hamann; George A. Montanye; Tom Streeter

[57] ABSTRACT

A microelectronic device is rendered resistant to reverse engineering by encapsulating it in a dual layer encapsulant. The inner layer is compatible with the operation of the device, and has a greater resistance to chemical attack then does the device. The outer layer includes a filler of barium sulfate and gadolinium oxide, to absorb X-rays and N-rays respectively, is more resistant to chemical attack than the inner layer, and includes a groove around its periphery, to preferentially allow chemical attack radially. A full chemical attack damages the device beyond usable inspection, but a partial chemical attack is insufficient to remove X-ray and N-ray concealment.

16 Claims, 3 Drawing Sheets

REVERSE-ENGINEERING RESISTANT ENCAPSULANT FOR MICROELECTRIC DEVICE

BACKGROUND OF THE INVENTION

This invention relates to apparatus for resisting reverse engineering a microelectronic device, and has particular relation to such apparatus which resists reverse engineering efforts employing chemical, X-ray, or neutron ray (N-ray) attack.

As competition increases between manufacturers of electronic devices, trade secret protection assumes growing importance. Each manufacturer must assure that the extremely valuable and extensive engineering effort needed to invent, research, and develop a new product is not reproduced, at a tiny fraction of its original cost, by a competing manufacturer who simply buys the product on the open market and copies it. Encapsulants which are adequate to protect the operation of the device against vibration, contamination, and other environmental threats have generally been insufficient to also protect the device from inspection and reverse engineering by competitors.

SUMMARY OF THE INVENTION

It is an objective of the present invention to provide such a reverse-engineering resistant encapsulant. In its best mode, it substantially impedes reverse engineering efforts, even under combined chemical, X-ray, and N-ray assault, yet does not interfere with the operation of the device; and, indeed, it provides protection from environmental threats comparable to that provided by conventional encapsulants.

In accordance with the present invention, a reverse-engineering resistant encapsulant for a microelectronic device comprises an inner layer of material in adhesive contact with the device, and an outer layer of material in adhesive contact with the inner layer.

A "device", as used herein, need not be a single chip, but may include a plurality of chips or other devices.

The inner layer material is more compatible with the device than is the outer layer material. The compatibility of a material with the device is determined by the ability of the device to function when it is in contact with the material. This is generally accomplished by reducing or eliminating the ion impurity content of the material, and by matching the thermal coefficient of expansion of the material to that of the electronic device. "More compatible" means that the device functions better.

The outer layer material is more resistant to chemical attack than is the inner layer material, and the inner layer material is more resistant to chemical attack than is the device. A first material is "more resistant to chemical attack" than a second material, within the meaning of the present invention, if any fluid chemical ordinarily used to dissolve both materials dissolves an exposed surface of the first material at a slower speed (millimeters per hour) than it dissolves an exposed surface of the second material. This is preferably accomplished by causing the outer layer material and the inner layer material to include cross-linked polymer molecules, the outer layer molecules being more highly cross-linked than the inner layer molecules. One set of molecules is "more highly cross-linked" than a second set of molecules if there are more cross links per unit length of the polymer chain in the first material than in the second.

The outer layer includes means for variably resisting chemical attack, preferably comprising a thinning of the outer layer at a periphery thereof.

The outer layer includes a material which absorbs X-rays, preferably comprising barium sulfate.

The outer layer material includes a material which absorbs N-rays, preferably comprising gadolinium oxide.

A material "absorbs" X-rays or N-rays, within the meaning of the present application, if it absorbs, blocks, or diffracts such rays to the extent that the shadow cast by the device in the presence of X-rays or N-rays is rendered sufficiently blurred or faint as to substantially impede any effort to deduce the structure of the device from the shadow.

DESCRIPTION OF THE PREFERRED EMBODIMENTS

Figure 1:
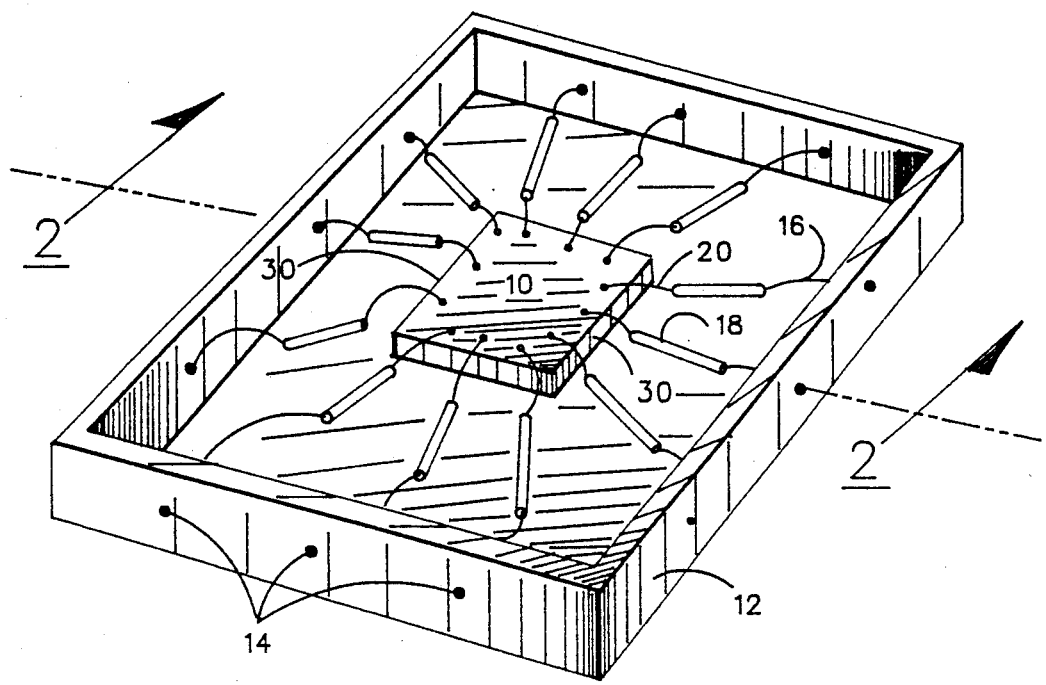
FIG. 1 is a perspective view of a chip in an open enclosure, ready to be encapsulated.

Turning now to FIG. 1, a chip 10 rests on an enclosure 12. The term "chip" is used broadly herein, and includes a plurality of chips or other electronic devices.

The enclosure 12 is in the form of an open package, and includes feed throughs 14 through which leads 16 may penetrate. This is typical for metal enclosure with an insulating ceramic layer, as is shown in FIG. 1, but the nature of the enclosure 12 is immaterial to, and forms no part of, the present invention. A ceramic enclosure could be used just as well, in which case integral leads would be substituted for the feed throughs 14. Likewise, different side-by-side insulating layers, or one or more multi-layers, could be used.

Figure 2:
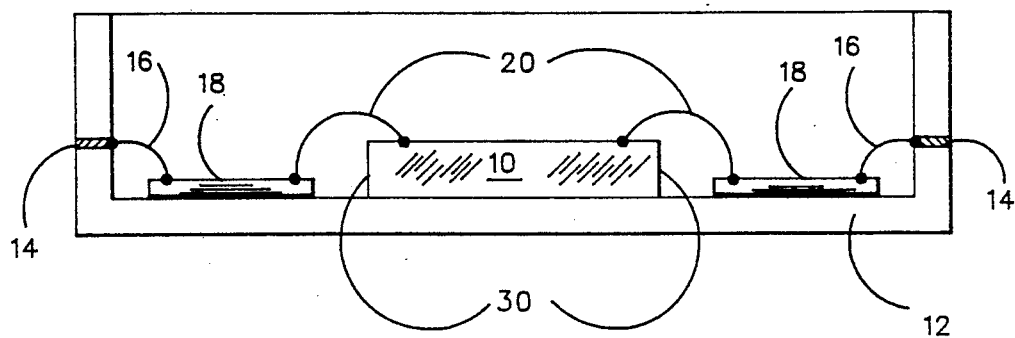
FIG. 2 is a cross section taken along the line 2—2 of FIG. 1.

The leads 16 are attached by traces 18 on the surface of the enclosure 12 to chip leads 20 which, in turn, take signals to and from the chip 10. This is seen in both the perspective view of FIG. 1, and a cross sectional view of FIG. 2. The traces 18 may be thin film, thick film, or any other conductive structure.

An inner layer 22 of material may be poured on top of the chip 10, partially filling the enclosure 12. The thickness of the layer 22 is sufficient to completely cover the chip 10, traces 18, leads 16, chip leads 20, and feed throughs 14. The layer 22 is made of a material which does not interact significantly with the chip 10, leads 16, traces 18, or chip leads 20. This is preferably achieved by a flexible material which has a low ion impurity content.

The material of the inner layer 22 is also relatively more resistant to chemical attack than is the chip 10. The purpose and function of this difference in resistance to chemical attack is that, when the entire structure is subjected to a chemical attack, and when the chemical first reaches any part of the chip 10, the chemical dissolves the adhesive bond to, or damages, etches, or destroys, the chip 10 before dissolving or destroying the inner layer 22. The inner layer 22 itself is finally dissolved only under severe conditions, and it is only then that the chip 10 is thereby exposed to inspection, by which time the chip 10 will have been so damaged as to make any inspection useless, and reverse engineering will be difficult or impossible.

An outer layer 24, preferably a plastic polymer, is poured over the inner layer 22. The outer layer 24 includes fillers to absorb X-rays and N-rays, such as barium sulfate (BaSO4) and gadolinium oxide (GdO) respectively. The outer layer 24 is made more resistant to chemical attach than is the inner layer 22. Thus, a chemical attack upon the entire assembly, when it finally penetrates the outer layer 24, will dissolve the inner layer 22 and damage the chip 10 beyond the capability of reverse engineering before finishing its dissolution of the outer layer 24. Thus, the topology of the chip 10 cannot be determined by an X-ray or N-ray inspection, because there will be sufficient of the outer layer 24, with its X-ray and N-ray blocking fillers, to prevent such an inspection.

Figure 4:
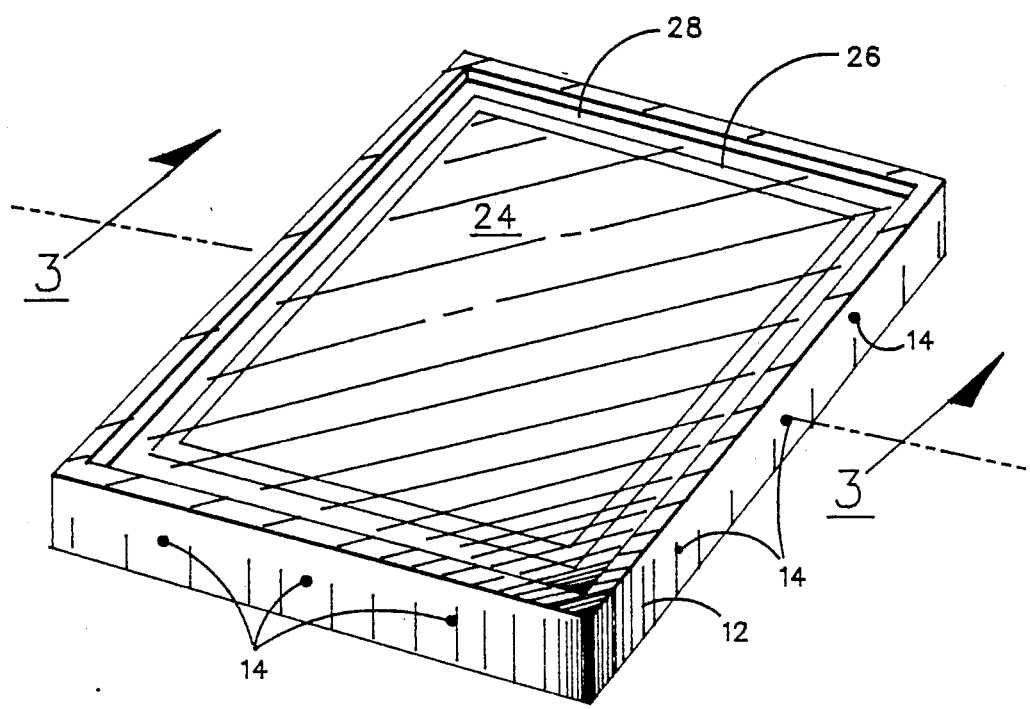
FIG. 4 is a perspective view of the exterior of the encapsulated chip, is comparable to FIG. 1, and shows the encapsulant's peripheral groove.

To accentuate this distinction in resistance to chemical attack, a groove 26 may be formed in the upper surface of the outer layer 24, near its periphery 28. This is shown in cross section in FIG. 3, and in perspective view in FIG. 4. The periphery 28 of the outer layer 24 will thus be the first to succumb to a chemical attack, and the chemical attack will continue radially inward through the inner layer 22 until it reaches the periphery 30 of the chip 10. It will then damage the chip 10, radially inward, beyond reconstruction before the inner layer 22 may be removed (for direct visual inspection), and before the outer layer 24 may be removed (for X-ray or N-ray inspection).

Figure 3:
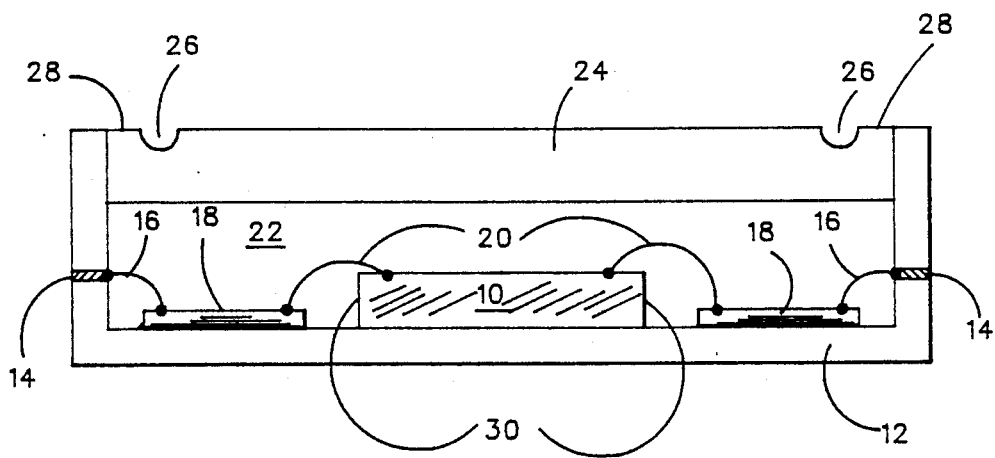
FIG. 3 is a cross section comparable to FIG. 2, showing the chip as encapsulated, and is taken along the line 3—3 of FIG. 4.
Figure 5:
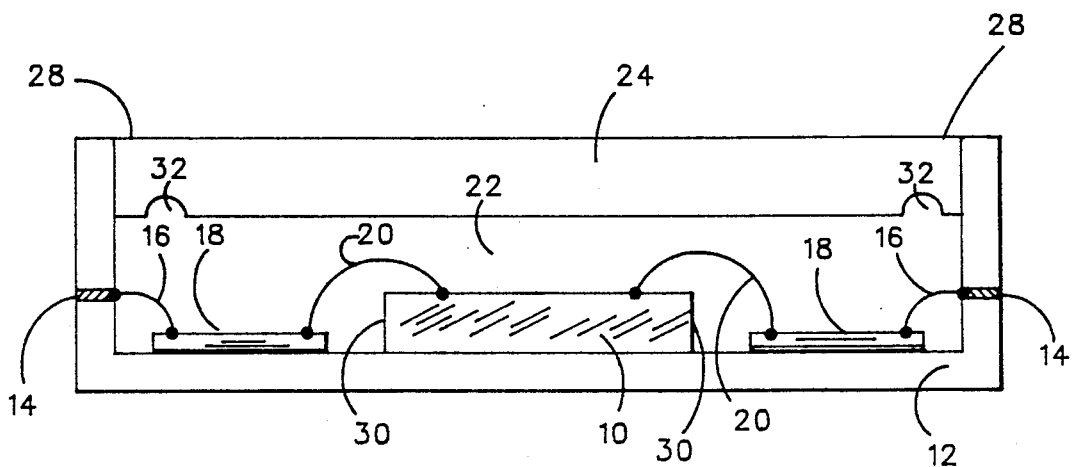
FIG. 5 is a cross section comparable to FIG. 3, and shows an encapsulated chip with an interior peripheral groove.

FIG. 5 is similar to FIG. 3 and shows an alternative way of thinning the outer layer 24 at its periphery 28. Instead of forming a groove 26 on the upper surface of the outer layer 24, as is shown in FIG. 3, the periphery of the outer layer 24 may be thinned by forming a ridge 32 at the upper surface periphery of the inner layer 22. If the upper surface of the outer layer 24 remains flat, the thickness of the outer layer 24 at its periphery 28 will nonetheless be sufficiently reduced as to encourage radially inward attack, as before.

Figure 6:
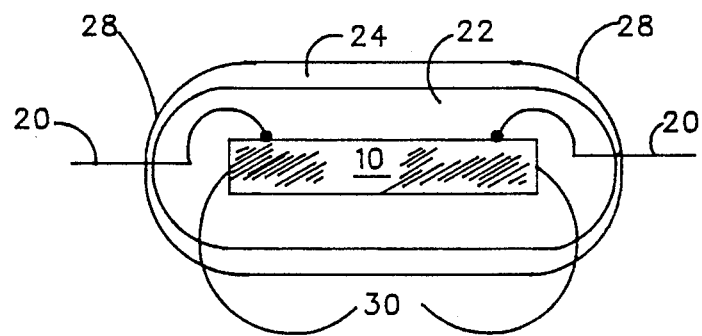
FIG. 6 is a cross section of another embodiment of the present invention, without an enclosure, and shows a peripheral thinning of the encapsulant in lieu of a groove.

As is shown in FIG. 6, neither a groove 26 nor ridge 32 is strictly necessary. If a chip 10 is encapsulated in an inner layer 22, without ever resting upon an enclosure 12, and if an outer layer of material 24 encapsulates the inner layer 22, with the periphery 28 of the outer layer 24 being thinner than the remainder of the outer layer 24, then chemical attack will proceed from the periphery, radially inward, as before, while retaining the protection against visual, X-ray, or N-ray inspection described above.

Applicants prefer to use, for the material of the inner layer 22, a polymer, preferably an epoxy, although a silicone is also suitable. Most preferably, the material 22 comprises an epoxy comprising of a resin blend including cycloaliphatic epoxies and a mixture of aromatic anhydride curing agents. This forms a lower stress material with low levels of ionic impurities. These materials are prefrozen and degassed single component epoxies of which the third generation "glob-top" encapsulant Hysol ES4323 is the preferred embodiment. The molecular chains of this material are somewhat cross-linked.

As with the inner layer 22, Applicants prefer to use, for the material of the outer layer 24, a polymer, again preferably an epoxy, although silicones or other highly cross-linked polymers are also suitable. Most preferably, the outer layer 24 comprises a two component mixture, comprising a novolac-epoxy prepolymer (the preferred embodiment being the Dow epoxy novolac (DEN) 438 series) and an epoxy-aromatic amine adduct curing agent (the preferred embodiment being an epoxy-methylene dianiline material). This mixture is then blended with barium sulfate and gadolinium oxide. The cross-linked molecules of this material are more strongly chemically resistant than are the cross-linked molecules of the material of the inner layer 22.

The preferred application technique is to apply the inner layer epoxy to the active components (chip 10, chip leads 20, etc.), and then cure it. The mixture of the outer layer is then compounded by mixing 100 parts of resin with between 10 and 20 parts of gadolinium oxide (preferably about 15 parts), and with between 10 and 20 parts of barium sulfate (preferably about 15 parts). Between 45 and 55 parts of hardener may then be blended in, preferably about 50 parts of hardener. All part ratios are stated on a weight to weight basis. Mild heating of the mixture is preferred for uniformity. The mixture is then applied to the cured inner layer, and is, itself separately cured after application.

While a particular embodiment of the present invention has been described in detail, the full spirit and scope of the present invention is defined by the following claims.

What is claimed is:

1. A reverse-engineering resistant encapsulant for a microelectronic device, comprising:
   an inner layer of material in adhesive contact with said device; and
   an outer layer of material in adhesive contact with said inner layer, wherein the material of said outer layer is more resistant to chemical attack than is the material of said inner layer, wherein the material of said inner layer is more resistant to chemical attack than is said device, and wherein said outer layer includes means for variably resisting chemical attack.

2. The encapsulant of claim 1, wherein the material of said outer layer and the material of said inner layer material include cross-linked polymer molecules, said outer layer molecules being more highly cross-linked than said inner layer molecules.

3. The encapsulant of claim 2, wherein said means for variable resisting chemical attack comprises a thinning of said outer layer at a periphery thereof.

4. The encapsulant of claim 3, wherein:
   the material of said outer layer includes a material which absorbs N-rays; and
   the material of said outer layer includes a material which absorbs X-rays.

5. The encapsulant of claim 4, wherein:
   the material of said inner layer is more compatible with said device than is the material of said outer layer;
   said material which absorbs N-rays comprises gadolinium oxide; and
   said material which absorbs X-rays comprises barium sulfate.

6. The encapsulant of claim 1, wherein said means for variably resisting chemical attack comprises a thinning of said outer layer at a periphery thereof.

7. The encapsulant of claim 1, wherein the material of said outer layer includes a material which absorbs N-rays.

8. The encapsulant of claim 1, wherein the material of said outer layer includes a material which absorbs X-rays.

9. The encapsulant of claim 8, wherein the material of said outer layer includes a material which absorbs N-rays.

10. A reverse-engineering resistant encapsulant for a microelectronic device, comprising:
   an inner layer of material in adhesive contact with said device; and
   an outer layer of material in adhesive contact with said inner layer, wherein the material of said outer layer includes a material which absorbs X-rays.

11. The encapsulant of claim 10, wherein the material of said inner layer is more compatible with said device than is the material of said outer layer.

12. The encapsulant of claim 10, wherein the material of said outer layer includes a material which absorbs N-rays.

13. A reverse-engineering resistant encapsulant for a microelectronic device, comprising:
   an inner layer of material in adhesive contact with said device; and
   an outer layer of material in adhesive contact with said inner layer, wherein the material of said outer layer includes a material, comprising barium sulfate, which absorbs X-rays.

14. A reverse-engineering resistant encapsulant for a microelectronic device, comprising:
   an inner layer of material in adhesive contact with said device; and
   an outer layer of material in adhesive contact with said inner layer, wherein the material of said outer layer includes a material which absorbs N-rays.

15. A reverse-engineering resistant encapsulant for a microelectronic device, comprising:
   an inner layer of material in adhesive contact with said device; and
   an outer layer of material in adhesive contact with said inner layer, wherein the material of said outer layer includes a material, comprising gadolinium oxide, which absorbs N-rays.

16. The encapsulant of claim 15, wherein the material of said inner layer is more compatible with said device than is the material of said outer layer.

* * * * *